(12) United States Patent
Hirose et al.

(10) Patent No.: US 12,232,421 B2
(45) Date of Patent: Feb. 18, 2025

(54) PIEZOELECTRIC COMPOSITION AND ELECTRONIC COMPONENT

(71) Applicant: TDK CORPORATION, Tokyo (JP)

(72) Inventors: Masakazu Hirose, Tokyo (JP); Yuiko Hirose, Tokyo (JP)

(73) Assignee: TDK CORPORATION, Tokyo (JP)

( * ) Notice: Subject to any disclaimer, the term of this patent is extended or adjusted under 35 U.S.C. 154(b) by 524 days.

(21) Appl. No.: 17/203,459

(22) Filed: Mar. 16, 2021

(65) Prior Publication Data
US 2021/0288239 A1 Sep. 16, 2021

(30) Foreign Application Priority Data

Mar. 16, 2020 (JP) .................. 2020-045651

(51) Int. Cl.
| | | |
|---|---|---|
| *H01L 41/083* | (2006.01) | |
| *H01L 41/047* | (2006.01) | |
| *H01L 41/187* | (2006.01) | |
| *H01L 41/297* | (2013.01) | |
| *H01L 41/43* | (2013.01) | |
| *H10N 30/067* | (2023.01) | |
| *H10N 30/097* | (2023.01) | |
| *H10N 30/50* | (2023.01) | |
| *H10N 30/853* | (2023.01) | |
| *H10N 30/87* | (2023.01) | |

(52) U.S. Cl.
CPC .......... *H10N 30/50* (2023.02); *H10N 30/067* (2023.02); *H10N 30/097* (2023.02); *H10N 30/8542* (2023.02); *H10N 30/87* (2023.02)

(58) Field of Classification Search
CPC ...... H10N 30/50; H10N 30/87; H10N 30/067; H10N 30/097; H10N 30/8542

USPC ......................................................... 310/311
See application file for complete search history.

(56) References Cited

U.S. PATENT DOCUMENTS

| | | | | |
|---|---|---|---|---|
| 6,093,338 | A * | 7/2000 | Tani ...................... | C04B 35/462 501/12 |
| 6,319,542 | B1 * | 11/2001 | Summerfelt ............ | H01L 28/56 427/126.3 |
| 6,797,127 | B1 * | 9/2004 | Murata ................. | B01D 53/007 422/186.3 |
| 2010/0004356 | A1 * | 1/2010 | Yoshinaga ............. | H01M 4/587 523/400 |
| 2014/0339458 | A1 | 11/2014 | Furukawa et al. | |
| 2016/0125766 | A1 * | 5/2016 | Ogawa .................. | G09B 23/286 434/262 |
| 2020/0295252 | A1 | 9/2020 | Katoh et al. | |
| 2020/0340096 | A1 * | 10/2020 | Sakashita ............. | H01J 37/3426 |
| 2024/0124321 | A1 * | 4/2024 | Schnitter .............. | C01G 33/006 |

FOREIGN PATENT DOCUMENTS

| | | |
|---|---|---|
| CN | 110494999 A | 11/2019 |
| JP | 2005-060213 A | 3/2005 |
| JP | 2006-196717 A | 7/2006 |
| JP | 2014-177355 A | 9/2014 |
| JP | 2014-224038 A | 12/2014 |
| WO | WO-2017200649 A2 * 11/2017 ........... C03C 21/008 |

* cited by examiner

*Primary Examiner* — Emily P Pham
*Assistant Examiner* — Monica Mata
(74) *Attorney, Agent, or Firm* — Oliff PLC (57) ABSTRACT

A piezoelectric composition according to the present invention comprising: a carbon, and a main component composed of an alkali metal niobate based compound. The amount of carbon contained is 350 to 700 ppm by weight.

14 Claims, 3 Drawing Sheets

PIEZOELECTRIC COMPOSITION AND ELECTRONIC COMPONENT

TECHNICAL FIELD

The present invention relates to a piezoelectric composition composed of an alkali metal niobate based compound, and an electronic component including the piezoelectric composition.

BACKGROUND

The piezoelectric composition has an effect (piezoelectric effect) in which charges occur on a surface when receiving a stress from an outer side and an effect (inverse piezoelectric effect) in which distortion occurs when an electric field is applied from an outer side on the basis of spontaneous polarization caused by a deviation of charges in a crystal. That is, the piezoelectric composition can convert mechanical energy and electric energy from each other.

As the piezoelectric composition, a lead-based piezoelectric component (hereinafter, referred to as "PZT-based compound") composed of lead zirconate ($PbZrO_3$) and lead titanate ($PbTiO_3$) is widely used as described in JP 2006-196717 A. However, the lead-based piezoelectric composition contains lead oxide (PbO) having a low melting point in an amount of approximately 60% by weight to 70% by weight, and thus the lead oxide is likely to volatilize at the time of firing. Therefore, from the viewpoint of environmental load, a lead-free piezoelectric composition becomes a very important issue.

With regard to the issue, recently, an alkali metal niobate based compound (for example, as disclosed in JP 2014-177355 A) has attracted attention as a new environment-friendly piezoelectric composition. The alkali metal niobate based compound has relatively high piezoelectric characteristics in comparison to another lead-free piezoelectric composition. However, the alkali metal niobate based compound is inferior to the PZT-based compound in the piezoelectric characteristics, and thus is not sufficient yet as a substitute for the PZT-based compound. Particularly, there is a demand for an improvement of a mechanical quality coefficient Qm and an improvement of stability of Qm with the passage of time.

SUMMARY

The invention was attained in view of above situation, and the object is to provide a lead-free piezoelectric composition has high mechanical quality coefficient Qm and satisfactory stability of Qm with the passage of time, and an electronic component including the piezoelectric composition.

In order to attain the above object, the piezoelectric composition according to the present invention is a piezoelectric composition including:
 a carbon and a main component composed of an alkali metal niobate based compound,
 wherein an amount of the carbon contained is 350 to 700 ppm by weight.

Conventionally, it is considered that the smaller the amount of carbon contained is preferable in order to obtain high piezoelectric characteristics in the piezoelectric composition. Actually, J P 2006-196717 A discloses that reduction of lead oxide is reduced by reducing the amount of carbon contained in a stacked body, and thus piezoelectric characteristics become satisfactory, in a piezoelectric element composed of a PZT-based compound. As a result of a thorough investigation, the present inventors obtained the following finding. In the piezoelectric composition composed of the alkali metal niobate based compound, by containing a predetermined amount of carbon, high mechanical quality coefficient Qm is obtained, and stability of Qm with the passage of time becomes satisfactory, contrary to above conventional technical idea.

Preferably, the alkali metal niobate based compound is expressed by a compositional formula of $(K_xNa_y)NbO_3$, and preferably,
 x satisfies a relationship of $0.5000 \leq x \leq 1.000$, and
 the sum of x and y satisfies a relationship of $0.980 \leq x+y \leq 1.000$.

By the alkali metal niobate based compound satisfies the above composition, a deliquescence phenomenon is suppressed, and thus high Qm and satisfactory stability with the passage of time can be satisfied in a compatible manner.

Preferably, the amount of carbon contained is 380 to 600 ppm by weight. By the amount of carbon contained in the piezoelectric composition is controlled within the above-described range, Qm is further improved, and stability with the passage of time becomes more satisfactory. In addition, insulation resistance becomes as high as $1 \times 10^{10}$ $\Omega \cdot cm$ or greater. And, by the insulation resistance becomes high, dielectric breakdown is less likely to occur even when a high voltage is applied during a polarization treatment and the like. That is, withstand voltage characteristics of the piezoelectric composition are improved.

Preferably, a CV value (Coefficient of Variation) of the carbon concentration distribution is 0.5 to 2.5 in a cross-section of the piezoelectric composition according to the present invention.

The CV value is an index representing the degree of dispersion in the concentration distribution, and the lower the CV value is, the smaller a variation of the concentration distribution is. In the piezoelectric composition of the present invention, by the CV value of the carbon concentration distribution is within the above-described range, Qm is further improved, and stability of Qm with the passage of time becomes more satisfactory. In addition, the insulation resistance becomes as high as $1 \times 10^{12}$ $\Omega \cdot cm$ or greater, and the withstand voltage characteristics are further improved.

An element including the piezoelectric composition according to the present invention can convert mechanical energy and electric energy from each other, and can be widely used as an electronic component in various fields. For example, the piezoelectric composition according to the present invention is applicable to a piezoelectric actuator using an inverse piezoelectric effect. In the piezoelectric actuator including the piezoelectric composition of the present invention, a minute displacement is obtained with accuracy with respect to an applied voltage, and a response speed is high. Accordingly, the piezoelectric actuator can be used, for example, as a drive element for optical parts, a head drive element for HDDs, a head drive element for inkjet printers, a drive element for fuel injection valves, and an element for haptics devices. In addition, the piezoelectric composition of the present invention is also applicable as a piezoelectric buzzer or a piezoelectric speaker that uses the inverse piezoelectric effect.

In addition, the piezoelectric composition according to the present invention is applicable to a sensor that reads a minute force or a minute amount of displacement by using the piezoelectric effect. In addition, since the piezoelectric composition of the present invention has excellent responsiveness, the piezoelectric composition itself or an elastic body joined to the piezoelectric composition can be excited to cause resonance, by applying an AC electric field thereto. According to this, the piezoelectric composition of the present invention is applicable to a piezoelectric transformer, an ultrasonic motor, and the like.

DETAILED DESCRIPTION OF THE PREFERRED EMBODIMENTS

Hereinafter, the present invention is described based on the embodiment shown in the drawings.

First, description is given of a piezoelectric element 5 (electronic component) to which a piezoelectric composition according to this embodiment is applied. The piezoelectric element 5 shown in FIG. 1 has a plate-shaped piezoelectric part 1, and a pair of electrodes 2 and 3 formed on a pair of opposite surfaces which are both main surfaces 1a and 1b of the piezoelectric part 1.

Figure 1:
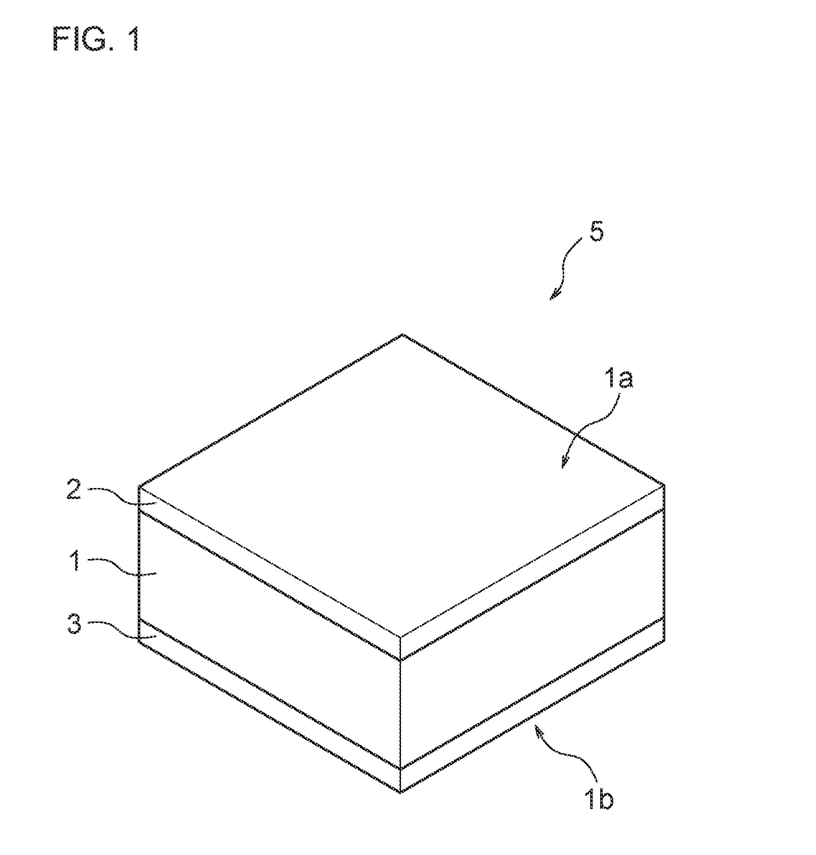
FIG. 1 is a schematic perspective view of a piezoelectric element according to an embodiment of the present invention.

The piezoelectric part 1 is a sintered body, and is constituted by the piezoelectric composition according to this embodiment. Details of the piezoelectric composition will be described later. In addition, the pair of electrodes 2 and 3 is constituted by a conductive material, and the conductive material can be arbitrarily set in correspondence with desired characteristics, uses, or the like without particular limitation. For example, gold (Au), silver (Ag), platinum (Pt), palladium (Pd), nickel (Ni), and copper (Cu), or an alloy containing at least one of the above elements can be used as the conductive material of the electrodes 2 and 3.

In FIG. 1, the piezoelectric part 1 has a rectangular parallelepiped shape, but the shape of the piezoelectric part 1 can be arbitrarily set in correspondence with desired characteristics, uses, or the like without particular limitation. In addition, dimensions of the piezoelectric part 1 can be arbitrarily set in correspondence with desired characteristics, uses, and the like without particular limitation.

In addition, the piezoelectric part 1 is polarized in a predetermined direction. For example, the piezoelectric element 5 shown in FIG. 1 is polarized in a thickness direction of the piezoelectric part 1, that is, a direction in which the electrodes 2 and 3 face each other. Then, for example, an external power supply, an external circuit, or the like is electrically connected to the electrodes 2 and 3 through a wire (not illustrated) or the like. Accordingly, for example, when a predetermined voltage is applied to the piezoelectric part 1 from the external power supply through the electrodes 2 and 3, in the piezoelectric part 1, electric energy is converted into mechanical energy due to the inverse piezoelectric effect, and thus the piezoelectric part 1 vibrates in a predetermined direction. In addition, when a stress is applied to the piezoelectric part 1 from the outer side, charges generated by a piezoelectric effect can be taken out to the external circuit through the electrodes 2 and 3.

Figure 2:
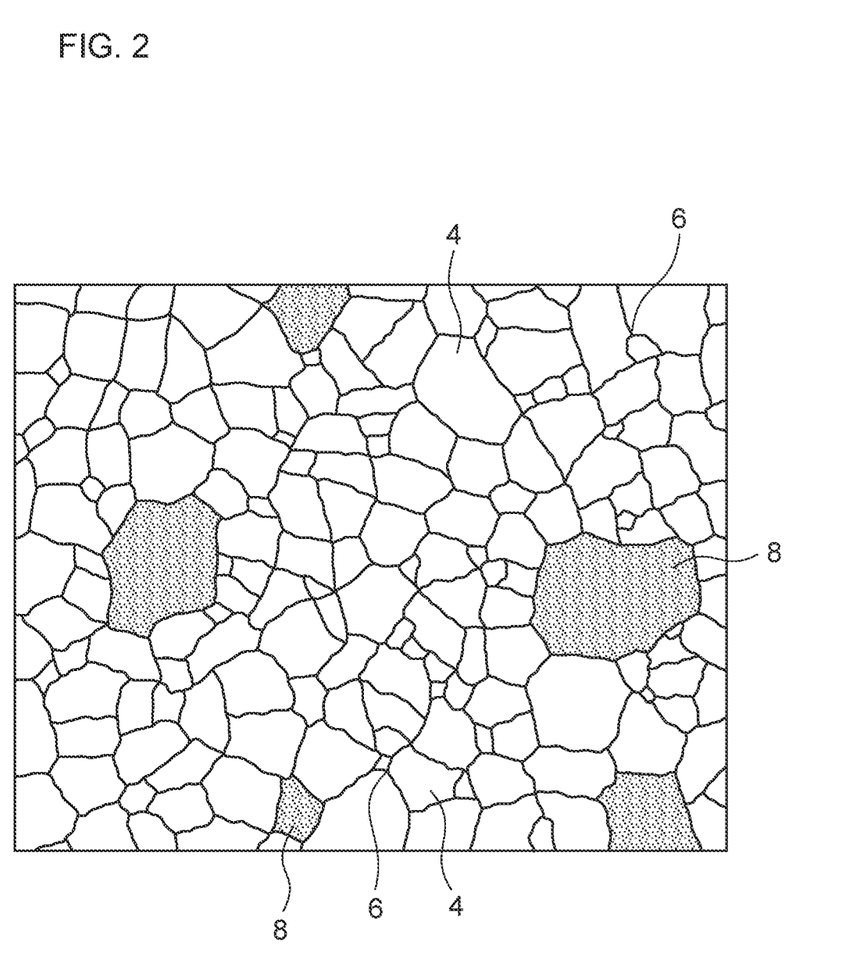
FIG. 2 is a schematic view illustrating a cross-section of the piezoelectric composition.

Next, a piezoelectric composition according to this embodiment is described. FIG. 2 is a cross-sectional view of the piezoelectric part 1 shown in FIG. 1, that is, a cross-sectional view of the piezoelectric composition. As shown in FIG. 2, the piezoelectric composition according to this embodiment has main phase grains 4, grain boundaries 6 that are boundary lines between the main phase grains 4, and secondary phases 8 existing between the main phase grains 4.

The main phase grains 4 contain a composite oxide having a perovskite structure expressed by a general formula $ABO_3$ as a main component. Note that, the main component is a component that occupies 90 mol % or more with respect to 100 mol % of the piezoelectric composition, in this embodiment.

In the perovskite structure, an element having a large ionic radius, for example, an alkali metal element, an alkali-earth metal element, or the like tends to occupy an A site of $ABO_3$, and an element having a small ionic radius, for example, a transition metal element or the like tends to occupy a B site of $ABO_3$. In addition, a $BO_6$ oxygen octahedron composed of a B-site element and oxygen constitutes a three-dimensional network sharing a vertex of each other, and a void of the network is filled with an A-site element, thereby forming the perovskite structure.

In this embodiment, the composite oxide as the main component of the piezoelectric composition is an alkali metal niobate based compound, and the general formula $ABO_3$ is expressed by a compositional formula $(K_xNa_y)NbO_3$. That is, the A-site element is potassium (K) and/or sodium (Na), and the B-site element is niobium (Nb).

In the compositional formula, "x" represents a ratio of the number of atoms of K to a total number of atoms of the B-site element, and "y" represents a ratio of the number of atoms of Na to the total number of atoms of the B-site element. Accordingly, "x+y" represents a ratio of the total number of atoms of the A-site element to the total number of atoms of the B-site element, that is, a so-called A/B ratio.

In this embodiment, "x" can be set to satisfy a relationship of $0<x\leq1.000$ and is preferably 0.5000 to 1.000. More preferably, "x" satisfies a relationship of $0.800\leq x\leq1.000$, and still more preferably $0.800\leq x\leq0.998$. That is, in this embodiment, it is preferable that an occupancy ratio of K in the A site is larger than that of Na.

In addition, "x+y" is preferably set to satisfy a relationship of $0.970\leq x+y\leq1.000$. More preferably, "x+y" is set to 0.980 to 1.000, and still more preferably 0.980 to 0.998. In this embodiment, satisfactory mechanical strength can be obtained by allowing the B-site element (Nb) to exist in excess in comparison to the A-site element (K, Na). Note that, in a case where "x+y" is greater than the above-described range (in the case of exceeding 1.0), since the piezoelectric composition exhibits high deliquescence, the strength tends to significantly decrease. Also, in a case where "x+y" is smaller than the above-described range, the density of the piezoelectric composition decreases, and thus the mechanical strength tends to decrease.

Further, a part of the B-site element may be substituted with tantalum (Ta). However, when Nb is substituted with Ta, a ratio of the number of atoms of Ta in the B site is preferably 10% or less.

In addition, it is preferable that the piezoelectric composition according to this embodiment contains copper (Cu) as a subcomponent. It is preferable that the content amount of Cu in the piezoelectric composition is within a range of 0 to 1.5 parts by mol in terms of CuO with respect to 100 parts by mol of the alkali metal niobate based compound as the main component. In the case of containing Cu as the subcomponent, an existence aspect thereof is not particularly limited, and Cu may be solid-dissolved in the main phase grains 4 constituted by the main component or may exist at the grain boundaries 6. In a case where Cu exists at the grain boundaries 6, Cu may form a compound with another element.

By Cu exists in the main phase grains 4 and/or at the grain boundaries 6, a coupling force between the main phase grains 4 becomes strong, and the mechanical strength of the piezoelectric composition can be enhanced. In addition, the amount of Cu contained relates to "x+y" described above, and when the amount of Cu contained and the range of "x+y" are set to the above-described ranges, Cu can be solid-dissolved in the main phase grains 4, or may remain at the grain boundary 6. As a result, the coupling force between the main phase grains 4 can be enhanced through the grain boundaries 6.

In addition, addition of Cu as the subcomponent also contributes to an improvement of a mechanical quality coefficient Qm. However, in a case where the amount of Cu contained is excessively large, there is a concern that a leak current caused by voltage application occurs during a polarization treatment of the piezoelectric composition, and sufficient polarization may not be obtained. In this case, polarization becomes insufficient, and piezoelectric characteristics exhibited by aligning a spontaneous polarization direction to a predetermined direction deteriorate conversely. In this embodiment, in the case of adding Cu as the subcomponent, by controlling the amount of Cu contained and the range of "x+y" within the above-described ranges, occurrence of the leak current is suppressed, and a sufficient polarization treatment can be performed. As a result, it contributes an improvement of the mechanical quality coefficient Qm.

In addition, the piezoelectric composition according to this embodiment may contain another component as an subcomponent other than Cu. For example, the piezoelectric composition may contain at least one kind selected from transition metal elements (element of Group 3 to Group 11 in a long period type periodic table) other than Nd, Ta, and Cu, elements of Group 2, elements of Group 12, and elements of Group 13 in the long period type periodic table, and germanium (Ge).

Specifically, examples of the transition metal elements other than rare-earth elements include chromium (Cr), manganese (Mn), iron (Fe), cobalt (Co), nickel (Ni), tungsten (W), and molybdenum (Mo). In addition, examples of the rare-earth elements include yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

Magnesium (Mg) and strontium (Sr) is exemplified as the elements of Group 2, zinc (Zn) is exemplified as the elements of Group 12, and aluminum (Al), gallium (Ga), and indium (In) are exemplified as the elements of group 13.

Note that, the subcomponents other than Cu may be added in combination with the Cu subcomponent, or may be added instead of the Cu subcomponent. Among the subcomponents (other than Cu), Ge, Cr, Ni, and Zn are preferably selected.

In the case of adding Ge as the subcomponent, the content amount of Ge is preferably within a range of 0 to 1.5 parts by mol in terms of $GeO_2$ with respect to 100 parts by mol of alkali metal niobate based compound. Ge is contained mainly at the grain boundaries 6, and by containing Ge at the grain boundaries 6, it is considered that a deliquescence phenomenon of the piezoelectric composition can be suppressed. Accordingly, it is preferable that the amount Ge solid-dissolved in the main phase grains 4 is small, and it is more preferable that Ge is not solid-dissolved in the main phase grains 4.

It is considered that the deliquescence phenomenon of the alkali metal niobate based compound is caused as follows. Specifically, the alkali metal compound (K, Na) contained in the compound undergoes a hydration reaction with moisture in the air. As a result, a portion that has undergone the hydration reaction becomes fragile, and the coupling force between the main phase grains 4 becomes weak. By containing Ge at the grain boundaries 6, it is considered that the alkali metal component is easily converted from a form in which the alkali metal component is likely to undergo the hydration reaction to a form in which the alkali metal component is less likely to undergo the hydration reaction, and deterioration of the mechanical strength based on the deliquescence phenomenon can be suppressed.

On the other hand, in the case of adding Cr, Ni, or Zn as the subcomponent, the content amount of the above elements is preferably within a range of 0 to 2.0 parts by mol in terms of $CrO_{3/2}$, NiO, or ZnO, with respect to 100 parts by mol of alkali metal niobate based compound. By containing the Cr, Ni, or Zn subcomponent within the above-described range, an electromechanical coupling coefficient $k_{31}$ and dielectric breakdown strength tend to be improved.

Note that, the piezoelectric composition according to this embodiment may contain lead (Pb) as an impurity, but the amount of Pb contained is preferably 1% by mass or less with respect to 100% by mass of piezoelectric composition, and it is more preferable that Pb is not contained.

In addition, the piezoelectric composition according to this embodiment contains carbon other than the main component and the subcomponents. Carbon is contained because an unreacted alkali metal remains during calcination to be described later. In this embodiment, it is preferable that the amount of carbon contained in the piezoelectric composition is 350 to 700 ppm by weight, more preferably 380 to 600 ppm by weight, and still more preferably 400 to 500 ppm by weight. Although details will be described later, by containing carbon within the above-described range, high Qm is obtained, and stability of Qm with the passage of time become satisfactory.

Note that, the mechanical quality coefficient Qm is an index indicating sharpness of mechanical vibration at a resonance frequency, and the higher a numerical value is, the more excellent characteristics are. It is required that the Qm is stable without varying vary (particularly, without decline) with the passage of time, and in this embodiment, "stability of Qm with the passage of time" is an index indicating stability of Qm.

Carbon contained in the piezoelectric composition exists mainly at the grain boundaries 6 and the secondary phases 8. It is preferable that carbon is not solid-dissolved in the main phase grains 4. The secondary phases 8 containing carbon exists between the main phase grains 4, that is, at a part of the grain boundaries 6, and may contain oxygen, K, Na, Nb, Cu, Zn, and the like other than carbon. It is considered that the piezoelectric composition that is the sintered body becomes denser due to existence of the secondary phases 8 containing carbon. Note that, it is considered that when K, Na, Nb, and the like which are also included in the main component are contained in the secondary phases 8 containing carbon, the coupling force between the main phase grains 4 can be maintained in a higher state.

In addition, it is preferable that an average grain size of the secondary phases 8 containing carbon is approximately the same as or equal to or greater than an average grain size of the main phase grains 4. Here, the average grain size of the main phase grains 4 may be controlled based on the viewpoints of exhibition of piezoelectric characteristics and mechanical strength. For example, in this embodiment, the average grain size is preferably set to 0.5 to 20 μm in terms of an equivalent circle diameter. On the other hand, it is preferable that the average grain size of the secondary phases 8 containing carbon is set to 1.0 to 3.0 times the average grain size of the main phase grains 4 in terms of the equivalent circle diameter. Note that, the average grain size of the main phase grains 4 and the average grain size of the secondary phases 8 can be obtained by observing a cross-section of the piezoelectric composition with a scanning electron microscope (SEM), a scanning transmission electron microscope (STEM), or the like, and by performing image analysis with respect to an obtained cross-sectional photograph.

In addition, it is preferable that carbon contained in the piezoelectric composition is dispersed under predetermined conditions without being locally concentrated. Specifically, in an arbitrary cross-section of the piezoelectric composition according to this embodiment, a CV value (coefficient of variation) of a carbon concentration distribution is preferably 0.50 to 2.50, and more preferably 0.50 to 2.00. Here, the CV value is expressed by a standard deviation/an average value, and is an index indicating the degree of dispersion. The lower the CV value is, the more uniformly carbon is dispersed.

Here, in this embodiment, the amount of carbon contained, and the CV value of the concentration distribution can be measured, for example, by the following method. First, the amount of carbon contained can be measured by a carbon sulfur analyzer (CS analyzer). In the CS analyzer, a powder obtained by pulverizing the piezoelectric composition in a mortar or the like is used as a measurement sample. In addition, the powder sample is heated and burned with a high-frequency furnace in the device to convert carbon contained in the sample into carbon dioxide ($CO_2$) and to convert sulfur into sulfur dioxide ($SO_2$) gas. In addition, the generated $CO_2$ and $SO_2$ are measured by a non-dispersive infrared absorption method or the like to calculate the amounts of carbon and sulfur contained in the measurement sample. Accordingly, the amount of carbon contained is a net amount of carbon contained in the measurement sample (piezoelectric composition), and it is preferable to perform the same measurement at least three times and to calculate the amount as an average value.

In addition, the CV value can be calculated by performing mapping analysis by electron probe microanalyzer (EPMA). In the mapping analysis by the EPMA, a predetermined cross-section (measurement region) is irradiated with electron beams at a constant interval, and component analysis is performed for every measurement point. According to this, a concentration distribution of a specific element (measurement element) can be visualized, that is, can be mapped. The concentration of the specific element at each measurement point is expressed by luminance corresponding to an integration intensity of a detection peak (a peak of a characteristic X-ray of the specific element), and the higher a luminance level is, the higher an existence ratio of the specific element at the measurement point is. Moreover, a measurement interval at the mapping analysis is equivalent to the size of one pixel in mapping data that is obtained, and the number of measurement points is equivalent to the number of pixels in the mapping data.

The CV value of the carbon concentration distribution is calculated on the basis of an average value and a standard deviation of a population by setting data of the luminance at each measurement point as the population. In calculation of the CV value, the measurement interval in the mapping analysis is preferably set to be smaller than 1 μm square, and the number of measurement points is preferably set to at least 128×128 or greater. In addition, it is preferable that the size of the measurement region is a region equivalent to 50 to 250 μm square (may be a rectangular region). In addition, with regard to the CV value, it is preferable that the mapping analysis is performed at least two times by changing the measurement region and the CV value is evaluated by an average value thereof.

Next, an example of a method for manufacturing the piezoelectric element 5 shown in FIG. 1 is described below.

First, raw materials of the piezoelectric composition are prepared. As raw materials of the alkali metal niobate based compound as the main component, a compound containing K and a compound containing Nb can be used, and a compound containing Na can be used as necessary. Examples of the compound containing K and the compound containing Na include carbonates, hydrogen carbonate compounds or the like. In addition, examples of the compound containing Nb include oxides or the like.

In addition, in a case where the piezoelectric composition contains the subcomponent, as a raw material of the subcomponent, for example, a metal simple substance, an oxide, a composite oxide, carbonate, oxalate, acetate, a hydroxide, a halide, an organic metal compound, or the like can be used. For example, in a case where Cu is added as the subcomponent, examples of the raw material of Cu include a Cu simple substance, a copper oxide, or a composite oxide containing Cu such as $K_\alpha Cu_\beta Ta_\gamma O_\delta$ and $K_\alpha Cu_\beta Nb_\gamma O_\delta$. Particularly, it is preferable to use the copper oxide (CuO).

The raw materials of the main component and the raw material of the subcomponent are powders, and an average particle size thereof is preferably within a range of 0.1 to 5.0 μm.

Next, the prepared raw materials of the main component are weighed in a predetermined ratio, and are mixed for 5 to 20 hours by using a mixer such as a ball mill. With regard to a mixing method, wet mixing or dry mixing may be used. Note that, in the case of performing the wet mixing, a mixed powder obtained after mixing is dried.

Next, the resultant raw material mixed in the above-described process is calcined. Here, it is considered that carbon contained in the piezoelectric composition is incorporated into the piezoelectric composition when an unreacted alkali metal component remaining after the calcination reacts with carbon dioxide in the air. That is, it is considered that the amount of carbon contained in the piezoelectric composition is proportional to the amount of the unreacted alkali metal component remained. Accordingly, it is preferable to control a shape of the piezoelectric composition in calcination and conditions in calcination so as to control the amount of carbon contained and the degree of dispersion of carbon within the above-described range.

For example, the shape in calcination is preferably set to a bulk shape (temporarily molded body) instead of a powder shape. In this case, a mixed powder of the raw materials is press molded before calcination to obtain a temporarily molded body. At this time, a uniaxial pressing device is preferably used as a molding device, and a pressure in molding is preferably set to approximately 10 to 50 MPa. In addition, the temporarily molded body may be obtained by using a cold isostatic press (CIP molding device).

In addition, with regard to calcination conditions, it is preferable that an in-furnace atmosphere is set to an air atmosphere, a holding temperature is set to 850° C. to 1030° C., and a holding time is set to 1 to 20 hours. When the temporarily molded body is calcined under the conditions, a calcined body of the composite oxide is obtained, and an appropriate amount of unreacted alkali metal component occurs in the calcined body.

Note that, the composite oxide that constitutes the obtained calcined body has the perovskite structure expressed by a general formula $KNbO_3$ or $(K, Na)NbO_3$. In addition, the obtained calcined body is pulverized by a pulverizer such as a ball mill for a predetermined time. An average particle size of the pulverized powder obtained in this manner is preferably 0.5 to 2.0 μm.

In addition, in the case of adding the subcomponent, the raw material of the subcomponent which is weighed in a predetermined ratio is added to the above pulverized powder, and mixed to obtain a powder of the piezoelectric composition. Mixing of the main component and the subcomponent may be performed in wet mixing or dry mixing by various mixers such as the ball mill and a bead mill as in mixing of the raw materials of the main component.

A green compact of the piezoelectric composition is prepared by using the powder obtained as described above. A method for molding the powder of the piezoelectric composition is not particularly limited, and may be appropriately selected in correspondence with a desired shape, desired dimensions, and the like. In the case of performing press molding, a predetermined binder and as necessary, additives such as a plasticizer, a dispersant, and a solvent are added to the powder of the piezoelectric composition, and then the resultant composite is molded into a predetermined shape to obtain a green compact. Alternatively, granulation may be performed by adding the binder and the like to the powder of the piezoelectric composition, and a green compact may be prepared by using the obtained granulated powder. Moreover, as necessary, the obtained green compact may be further pressurized by CIP or the like. Here, as the binder, for example, an acrylic binder, an ethyl cellulose binder, a polyvinyl butyral binder, or the like can be used.

The obtained green compact is subjected to a binder removal treatment. As binder removal treatment conditions, a holding temperature is preferably set to 400° C. to 800° C., and a temperature holding time is preferably set to 2 to 4 hours.

Next, the green compact after the binder removal treatment is subjected to main firing. As conditions of the main firing, a holding temperature is preferably set to 1000° C. to 1100° C., and a holding time is preferably set to 2 to 4 hours. In addition, it is preferable that a temperature raising rate and a temperature lowering rate in the main firing are set within a range of 1.5° C./min to 5.0° C./min. Furthermore, an in-furnace atmosphere in the firing is preferably set to an oxygen-containing atmosphere, and may be set to an air atmosphere.

The piezoelectric composition as a sintered body is obtained through the main firing. Note that, the amount of carbon contained in the piezoelectric composition may also vary in accordance with the composition of the main component or the kind of the subcomponent that is added.

The obtained sintered body is subjected to polishing as necessary, and an electrode paste is applied to both main surfaces of the sintered body and is baked to form virtual electrodes. Note that, a method of forming the virtual electrodes is not particularly limited, and may be performed by vapor deposition, sputtering, or the like.

Next, the sintered body in which the virtual electrodes are formed is subjected to a polarization treatment. The polarization treatment is performed in oil maintained at a predetermined temperature (approximately 80° C. to 150° C.) by applying an electric field of 2 to 5 kV/mm to the sintered body for approximately five minutes to one hour. Due to the polarization treatment, a piezoelectric composition in which a spontaneous polarization is aligned in a predetermined direction is obtained.

In addition, the piezoelectric composition after the polarization treatment is processed in predetermined dimensions as necessary, thereby forming the plate-shaped piezoelectric part 1. Next, the electrodes 2 and 3 are formed on the piezoelectric part 1 by a method such as baking of electrode paste, vapor deposition, sputtering, plating, or the like to obtain the piezoelectric element 5 shown in FIG. 1. Note that, as the electrodes 2 and 3, the virtual electrodes formed before the polarization treatment may be used as is.

(Summary of this Embodiment)

The piezoelectric composition according to this embodiment contains the alkali metal niobate based compound as a main component, and contains carbon within the above-described range (350 to 700 ppm by weight).

As a result of a thorough investigation, the present inventors obtained the following finding. In the piezoelectric composition composed of the alkali metal niobate based compound, by containing a predetermined amount of carbon, high mechanical quality coefficient Qm is obtained, and stability of Qm with the passage of time becomes satisfactory contrary to the spirit in the related art.

The reason why Qm and the stability of Qm with the passage of time are improved is not clear, but for example, the following reason is considered. In an alkali metal niobate based compound in the related art, an alkali metal element is likely to volatilize in firing, and a void, a defect, or the like is likely to occur inside the piezoelectric composition after firing. In this case, by existing the void or the defect inside the piezoelectric composition, it is considered that moisture or the like in the air is adsorbed to the void or the defect, and vibration (driving) of the piezoelectric composition is hindered. In addition, it is considered that moisture or the like in the air reacts with an alkali metal component contained in the piezoelectric composition, and deterioration of Qm with the passage of time occurs.

In contrast, in the piezoelectric composition according to this embodiment, it is considered that a carbon component exists as the secondary phases 8 mainly between the main phase grains 4. In addition, it is considered that occurrence of the void of the defect is suppressed due to the carbon component existing in the secondary phases 8. According to this, in the piezoelectric composition of this embodiment, it is considered that hindrance of vibration due to adsorption of moisture or the like and a reaction between the moisture and the alkali metal component as described above are suppressed, and Qm is improved, and Qm is less likely to deteriorate with the passage of time.

In addition, in the piezoelectric composition according to this embodiment, as described above, the alkali metal based niobate compound is expressed by a compositional formula $(K_xNa_y)NbO_3$, and "x" and "x+y" in the compositional formula satisfy predetermined relationships. By being the main component within a predetermined range, Qm becomes more higher, and the deliquescence phenomenon can be suppressed.

In addition, in the piezoelectric composition according to this embodiment, by controlling the amount of carbon contained within a predetermined range (380 to 600 ppm by weight or 400 to 500 ppm by weight), high Qm is maintained, and stability of Qm with the passage of time can be further improved. Moreover, insulation resistance becomes as high as $1 \times 10^{10}$ Ω·cm or greater. When the insulation resistance becomes high, dielectric breakdown is less likely to occur even when a high voltage is applied during a polarization treatment. That is, withstand voltage characteristics of the piezoelectric composition are improved.

In addition, in the piezoelectric composition according to this embodiment, the CV value of the concentration distribution of carbon in an arbitrary cross-section is controlled within the above-described range. According to this, Qm is further improved, and stability of Qm with the passage of time becomes further satisfactory. In addition, the insulation resistance becomes as high as $1 \times 10^{12}$ Ω·cm or greater, and the withstand voltage characteristics are further improved.

Modification Example

In the above-described embodiment, description has been given of the piezoelectric element 5 in which the piezoelectric part 1 is a single layer, but a piezoelectric element may having a configuration in which the piezoelectric layers are laminated is also possible. In addition, a piezoelectric element may having a configuration in which the single layer portion and the laminated portion are combined is also possible. More specifically, "combination configuration" is a case where the piezoelectric element has a region in which piezoelectric layers and internal electrode layers are alternately laminated, and a region constituted by only the piezoelectric part without laminating of the electrode layers.

Figure 3:
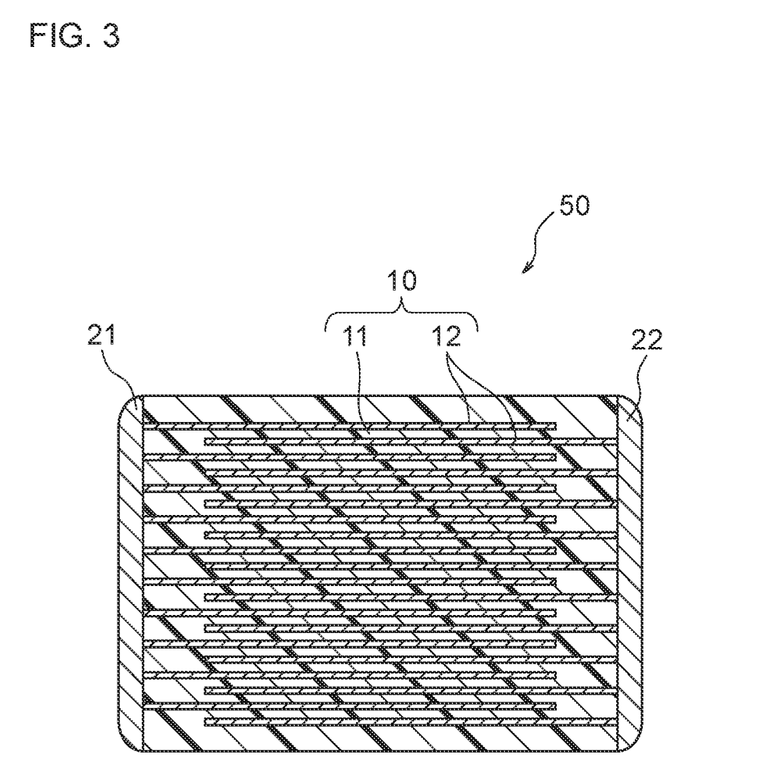
FIG. 3 is a schematic cross-sectional view illustrating a modification example of the piezoelectric element according to the embodiment.

As the piezoelectric element having laminated the piezoelectric layer, for example, a piezoelectric element 50 shown in FIG. 3 is exemplified. The piezoelectric element 50 has a stacked body 10 in which a plurality of piezoelectric layers 11 constituted by the piezoelectric composition according to this embodiment, and a plurality of internal electrode layers 12 are alternately laminated. A pair of terminal electrodes 21 and 22, which are electrically connected to the internal electrode layers 12 alternately disposed inside the stacked body 10, are formed on both end portions of the stacked body 10.

The thickness (interlayer thickness) of each of the piezoelectric layers 11 is not particularly limited, and can be arbitrarily set in correspondence with desired characteristics, a desired use, or the like. Typically, the interlayer thickness is preferably approximately 1 to 100 μm. The number of piezoelectric layers 11 laminated is not particularly limited, and can be arbitrarily set in correspondence with the desired characteristic, the desired use, or the like.

In addition, the internal electrode layers 12 are composed of a conductive material, and mainly contain a noble metal element such as Ag, Pd, Au, and Pt, a base metal element such as Cu and Ni, or an alloy including at least one kind among the elements. The thickness of each of the internal electrode layers is also not particularly limited, and can be set to, for example, 0.5 to 2.0 μm. Note that, the terminal electrodes 21 and 22 can be set to have the same configuration as in the electrodes 2 and 3 shown in FIG. 1.

For example, the piezoelectric element 50 shown in FIG. 3 is manufactured as follows. Specifically, a green chip that becomes the stacked body 10 is prepared, and the green chip is fired to obtain the stacked body 10. Then, the terminal electrodes 21 and 22 are printed or transferred to the stacked body 10 and are fired. Examples of a method for manufacturing the green chip include a typical printing method using paste, and a sheet method. In both the printing method and the sheet method, paste obtained by mixing the powder of the piezoelectric composition and a vehicle obtained by dissolving a binder in a solvent is used as paint.

Note that, conditions of the binder removal treatment and the main firing may be set as in the above-described embodiment. However, in a case where the internal electrode layers 12 are constituted by a base metal, it is preferable to perform the main firing in a nitrogen atmosphere or a mixed atmosphere of nitrogen and hydrogen. In this case, it is preferable to perform re-oxidization treatment after the main firing.

As in the piezoelectric element 50 shown in FIG. 3, since the plurality of piezoelectric layers 11 are laminated, a displacement amount and a drive force per unit volume can be further enlarged in comparison to the non-laminated type piezoelectric element 5. Note that, even in the piezoelectric element 50, since the piezoelectric composition according to this embodiment is included, the same effect as in the above-described embodiment is obtained.

The piezoelectric elements 5 and 50 as shown in FIG. 1 and FIG. 3 can convert mechanical energy and electric energy from each other, and can be widely used in various fields as an electronic component. For example, application to a piezoelectric actuator using the inverse piezoelectric effect is possible. Since minute displacement is obtained with accuracy and a response speed is fast with respect to an applied voltage, for example, the piezoelectric actuator including the piezoelectric composition of the present invention can be used as a drive element for optical parts, a head drive element for HDDs, a head drive element for inkjet printers, a drive element for fuel injection valves, and an element for haptics devices. In addition, the piezoelectric elements 5 and 50 are also applicable as a piezoelectric buzzer or a piezoelectric speaker that uses the inverse piezoelectric effect.

In addition, the piezoelectric elements 5 and 50 are applicable to a sensor that reads a minute force or a minute amount of displacement by using the piezoelectric effect. Furthermore, since the piezoelectric elements 5 and 50 including the piezoelectric composition of the present invention have excellent responsiveness, the piezoelectric composition itself or an elastic body joined to the piezoelectric composition is excited by applying an AC electric field thereto, resonance can be caused to occur. According to this, application to a piezoelectric transformer, an ultrasonic motor, and the like is also possible.

Hereinbefore, the embodiment of the invention has been described, but the present invention is not limited to the above embodiments, and various modifications can be made within the scope of the present invention. For example, the piezoelectric element 5 shown in FIG. 1 has an approximately rectangular shape in a plan view, but there is no limitation to the shape, and the piezoelectric element 5 may have a shape in a plan view such as an elliptical shape, a circular shape, and a polygonal shape. In addition, in the piezoelectric element 50 shown in FIG. 3, the terminal electrodes 21 and 22 are electrically connected to the internal electrode layers 12, but there is no limitation thereto. For example, electrical conduction with the internal electrode layers 12 may be realized by electrically connecting the internal electrode layer 12 to a pair of through-hole electrodes, and by connecting the through-hole electrodes to lead-out electrodes formed on the main surfaces of the stacked body 10.

EXAMPLES

Hereinafter, the present invention is described in more detail with reference to examples and comparative examples. However, the present invention is not limited to the following examples.

(Experiment 1)

In Experiment 1, piezoelectric composition samples according to Examples 1 to 7 were prepared by changing the level of the amount of carbon contained. Hereinafter, details of experimental conditions are described.

First, as raw materials of the alkali metal niobate based compound that is a main component of the piezoelectric composition, a powder of potassium hydrogen carbonate ($KHCO_3$) and a powder of niobium oxide ($Nb_2O_5$) were prepared. In addition, as a raw material of a subcomponent, a powder of copper oxide (CuO) was prepared.

In addition, the prepared raw materials of the main component were weighed so that a piezoelectric composition (sintered body) after firing has a composition shown in Table 1. The weighed powders of $KHCO_3$ and $Nb_2O_5$ were wet mixed by a ball mill for 16 hours, and were dried at 120° C. to obtain a mixed powder.

Next, the mixed powder of the raw materials was pressed by using a uniaxial pressing device at a condition of a molding pressure of 20 MPa, thereby obtaining a temporarily molded body. In addition, the temporarily molded body was calcined at a predetermined temperature for 4 hours to obtain a calcined body of the alkali metal niobate based compound. In Experiment 1, the amount of carbon contained in the samples of the examples was adjusted in accordance with holding temperatures in calcination. The holding temperatures in calcination in Examples 1 to 7 are shown in Table 1. Note that, an atmosphere in calcination was set to an air atmosphere.

Next, the calcined body was pulverized by a ball mill for 16 hours to obtain a pulverized powder. In addition, a predetermined amount of CuO powder was added to the pulverized powder, and the resultant mixture was wet mixed by a ball mill for 16 hours and was dried in a constant temperature bath maintained at 120° C., thereby obtaining a powder of the piezoelectric composition. At this time, the amount of CuO added was set to 1.0 part by mol with respect to 100 parts by mol of main component. Next, a binder was added to the above powder, and the resultant mixture was mixed and classificated with a mesh to obtain a granulated powder. In addition, the obtained granulated powder was molded by applying a load of 196 MPa with a press molding device, thereby obtaining a plate-shaped green compact.

The plate-shaped green compact obtained as described above was subjected to a binder removal treatment under conditions of 550° C. and three hours. In addition, the green compact after the binder removal treatment was subjected to main firing in an air atmosphere under conditions of 1050° C. and two hours, thereby obtaining a sintered body. Note that, in the main firing, a temperature rising rate and a temperature lowering rate were set to 5° C./min.

Next, the obtained sintered body was polished to a parallel plate shape having a thickness of 1.0 mm. In addition, silver paste was printed onto both surfaces of the sintered body having the parallel plate shape, and baking was performed at 800° C. to provide opposite silver electrodes. In addition, the sintered body after forming the electrodes was cut in dimensions of a length of 12 mm and a width of 3 mm. Finally, an electric field of 3 kV/mm was applied in silicone oil at 150° C. for five minutes to perform a polarization treatment of the piezoelectric composition, thereby obtaining the piezoelectric composition sample according to each of Examples 1 to 7. Note that, at least five or greater piezoelectric composition samples were prepared for each of the examples, and the following evaluation was performed.

Measurement of Amount of Carbon Contained

The amount of carbon contained in each of the piezoelectric composition sample was measured by using a carbon and sulfur analyzer (CS600) manufactured by LECO JAPAN CORPORATION. Here, the sample for measurement was obtained by pulverizing the piezoelectric composition sample using an agate mortar. In addition, CS analysis was performed three times, and the amount of carbon contained in each example was calculated as an average value.

Measurement of Mechanical Quality Coefficient Qm

Qm of the piezoelectric composition sample was measured by an impedance analyzer (4194A) manufactured by KEYSIGHT TECHNOLOGIES Inc. Note that, Qm was measured after leaving the piezoelectric composition sample at room temperature for 24 hours after the polarization treatment. In this example, a pass and fail criterion of Qm was set to 1000 or greater, and 1500 or greater was judged to be good, and 1800 or greater was judged to be even better.

Evaluation Stability with Passage of Time

The stability of the piezoelectric composition sample with the passage of time was evaluated by calculating a variation rate of Qm after passage of a long period of time. Specifically, after passage of 100 hours after the polarization treatment, Qm was measured again in a similar manner as described above, and a variation rate ($\Delta Qm$) of Qm was obtained by the following calculation expression.

$\Delta Qm$(unit: %)={($Qm$ after passage of 100 hours from polarization–$Qm$ after passage of 24 hours from polarization)/$Qm$ after passage of 24 hours from polarization}×100

In this example, a pass and fail criterion of $\Delta Qm$ was set to 20% or less, and 10% or less was judged to be good.

Note that, with respect to the obtained piezoelectric composition sample, an element analysis by EPMA and X-ray fluorescent analyzer (XRF) was also performed in addition to the evaluation. As a result, in all examples, it was confirmed that the main composition having the composition according to a target value was contained, and the subcomponent (Cu) was contained in accordance with a target value.

Comparative Example 1 and Comparative Example 2

In Comparative Example 1 and Comparative Example 2, piezoelectric composition samples were prepared by changing the shape in the calcination and the holding temperature in the calcination from Examples 1 to 7. Specifically, in Comparative Example 1, the shape in the calcination was set to "temporarily molded body" and the holding temperature was set to 1040° C. On the other hand, in Comparative Example 2, the shape in the calcination was set to "powder" and the holding temperature was set to as low as 800° C.

The experimental conditions other than the above in Comparative Example 1 and 2 were the similar as in Examples 1 to 7, and the same evaluations as in Examples 1 to 7 were performed. [0095]

Evaluation Result 1

Evaluation results of Experiment 1 are shown in Table 1.

TABLE 1

| Sample No. | Main component: $(K_xNa_y)NbO_3$ | | | Subcomponent | | Calcination conditions | | Mechanical quality coefficient Qm (−) | Stability with passage of time ΔQm (%) |
|---|---|---|---|---|---|---|---|---|---|
| | x | y | x + y | Raw material | Shape | Holding temperature (° C.) | Amount of carbon contained (ppm by weight) | | |
| Example 1 | 0.998 | 0 | 0.998 | CuO | Temporarliy molded body | 1020 | 360 | 2240 | 18 |
| Example 2 | 0.998 | 0 | 0.998 | CuO | Temporarliy molded body | 1010 | 390 | 2200 | 14 |
| Example 3 | 0.998 | 0 | 0.998 | CuO | Temporarliy molded body | 1000 | 420 | 2170 | 8 |
| Example 4 | 0.998 | 0 | 0.998 | CuO | Temporarliy molded body | 975 | 440 | 1900 | 5 |
| Example 5 | 0.998 | 0 | 0.998 | CuO | Temporarliy molded body | 950 | 450 | 1780 | 5 |
| Example 6 | 0.998 | 0 | 0.998 | CuO | Temporarliy molded body | 925 | 500 | 1630 | 5 |
| Example 7 | 0.998 | 0 | 0.998 | CuO | Temporarliy molded body | 900 | 630 | 1300 | 3 |
| Comparative Example 1 | 0.998 | 0 | 0.998 | CuO | Temporarliy molded body | 1040 | 200 | 1420 | 45 |
| Comparative Example 2 | 0.998 | 0 | 0.998 | CuO | Powder | 800 | 720 | Measurement is impossible | |

As shown in Table 1, in Comparative Example 1 in which the amount of carbon contained is as small as 200 ppm by weight, Qm was 1000 or greater, but ΔQm was as very high as 45%, and the stability of Qm with the passage of time was very bad. Typically, Qm and ΔQm have a contradictory relationship, and as Qm becomes high, a value of ΔQm increases, and the stability tends to deteriorate. That is, as shown by the evaluation results of Comparative Example 1, it is difficult that high Qm and satisfactory ΔQm are satisfied in a compatible manner.

In addition, with respect to Comparative Example 2 in which the amount of carbon contained was as large as 720 ppm by weight, polarization could not be performed sufficiently, and Qm and ΔQm could not be measured. The reason why polarization could not be performed in Comparative Example 2 is considered as follows. An unreacted K component remained more than necessary after calcination, and thus a large amount of moisture was adsorbed to the piezoelectric composition and a resistance rate greatly decreased.

In contrast to Comparative Example 1 and Comparative Example 2, in Examples 1 to 7, results in which Qm and ΔQm satisfy the pass and fail criterion in combination were obtained. As a result, in a case where the amount of carbon contained is within a range of 350 to 700 ppm by weight, it was proved that high Qm and satisfactory stability with the passage of time are satisfied in a compatible manner.

(Experiment 2)

In Experiment 2, piezoelectric composition samples according to Examples 12 to 21 were prepared by changing the composition of the main component and the kind of the subcomponent that was added. Specifically, in Examples 12 to 15, as the raw materials of the main component, in addition to $KHCO_3$ and $Nb_2O_5$, sodium hydrogen carbonate ($NaHCO_3$) was prepared, and ratios of the number of atoms of K and Na (that is, x and y in the compositional formula) in the obtained piezoelectric composition were set to values shown in Table 2. Note that, in Examples 12 to 15, "x+y" was set to 1.000.

In addition, in Examples 16 and 17, piezoelectric composition samples were prepared by setting a ratio of a total number of atoms of the A site to a total number of atoms of the B site (that is, "x+y" in the compositional formula) was set to a value shown in Table 2.

In addition, in Examples 18 to 21, the configuration of the subcomponent was changed from Experiment 1. In Example 18, as the subcomponent, 1.0 part by mol of CuO was added to 100 parts by mol of main component, and then 0.5 parts by mol of zinc oxide (ZnO) was further added to 100 parts by mol of main component. In Example 19, as the subcomponent, 1.0 part by mol of CuO was added to 100 parts by mol of main component, and then 0.8 parts by mold of germanium oxide ($GeO_2$) was further added to 100 parts by mol of main component. In Example 20, as the subcomponent, 1.6 parts by mol of manganese carbonate ($MnCO_3$) was added to 100 parts by mol of main component instead of CuO, and in Example 21, 0.38 parts by mol of composite oxide ($K_{5.4}Cu_{1.3}Ta_{10}O_{29}$) containing Cu was added to 100 parts by mol of main component instead of CuO.

Note that, in respective examples of Experiment 2, the shape in calcination was set to "temporarily molded body (bulk shape)", and the holding temperature in the calculation was set to 1000° C. In addition, in Experiment 2, the piezoelectric composition samples according to Examples 12 to 21 were obtained in a state in which the other experimental conditions were similar as in Experiment 1.

In addition, in Experiment 2, in addition to the evaluation performed in Experiment 1, resistivity ρ of the piezoelectric composition samples was also measured. The resistivity ρ was measured by applying a voltage of 40 V to the piezoelectric composition samples by using a digital ultra-high resistance/minute ampere meter (R8340) manufactured by ADVANTEST CORPORATION. A pass and fail criterion of the resistivity was set to $1\times10^{10}$ Ω·cm or greater, $1\times10^{11}$ Ω·cm or greater was judged to be good, and $1\times10^{12}$ Ω·cm or greater was judged to be even better. Evaluation results of Experiment 2 are shown in Table 2.

TABLE 2

| Sample No. | Main component: $(K_xNa_y)NbO_3$ | | | Subcomponent | | Amount of carbon contained (ppm by weight) | Mechanical quality coefficient Qm (−) | Stability with passage of time ΔQm (%) | Resistivity ρ (Ω · cm) |
|---|---|---|---|---|---|---|---|---|---|
| | x | y | x + y | Raw material 1 | Raw material 2 | | | | |
| Example 12 | 0.500 | 0.500 | 1.000 | CuO | — | 410 | 1570 | 8 | $2.0 \times 10^{11}$ |
| Example 13 | 0.800 | 0.200 | 1.000 | CuO | — | 430 | 1700 | 8 | $7.5 \times 10^{10}$ |
| Example 14 | 0.900 | 0.100 | 1.000 | CuO | — | 440 | 1750 | 7 | $6.3 \times 10^{10}$ |
| Example 15 | 1.000 | 0 | 1.000 | CuO | — | 440 | 1830 | 6 | $5.0 \times 10^{11}$ |
| Example 16 | 0.980 | 0 | 0.980 | CuO | — | 420 | 1880 | 6 | $1.0 \times 10^{12}$ |
| Example 17 | 0.990 | 0 | 0.990 | CuO | — | 430 | 1900 | 7 | $8.2 \times 10^{11}$ |
| Example 18 | 0.995 | 0 | 0.995 | CuO | ZnO | 430 | 1940 | 6 | $4.5 \times 10^{11}$ |
| Example 19 | 0.995 | 0 | 0.995 | CuO | $GeO_2$ | 420 | 1800 | 6 | $1.1 \times 10^{11}$ |
| Example 20 | 0.995 | 0 | 0.995 | $MnCO_3$ | — | 360 | 1020 | 15 | $3.5 \times 10^{11}$ |
| Example 21 | 0.500 | 0.500 | 1.000 | $K_{5.4}Cu_{1.3}Ta_{10}O_{29}$ | — | 380 | 1690 | 5 | $5.0 \times 10^{11}$ |

As shown in Table 2, it could be understood that the amount of carbon contained also varies when changing the composition of the main component and the kind of the subcomponent that is added. In addition, by comparing Examples 12 to 15 with each other, it could be confirmed that when the ratio of K is greater than Na, Qm become higher, and the stability of Qm with the passage of time is more improved (ΔQm becomes lower).

In addition, by comparing Examples 18 to 21 with each other, it can be understood that Qm is higher and ΔQm is lower in other examples in which Cu was added in comparison to Example 20 in which Mn was added. As a result, it could be understood that a compound containing Cu is preferable as the subcomponent that is added, and CuO is particularly preferable.

(Experiment 3)

In Experiment 3, piezoelectric composition samples according to Example 31 and Example 35 were prepared by changing the level of the CV value. In Experiment 3, the degree of dispersion of carbon (CV value) was adjusted by controlling the holding temperature in the calcination and the holding temperature in the main firing. Specifically, in Example 31, the holding temperature in the calcination was set to 1000° C. and the holding temperature in the main firing was set to 1050° C. On the other hand, in Example 35, the holding temperature in the calcination was set to 990° C. and the holding temperature in the main firing was set to 1040° C.

In addition, in Experiment 3, the CV value of the obtained piezoelectric composition samples was measured by mapping analysis of EPMA. Specifically, mapping analysis for three visual fields was performed under conditions of a measurement interval of 0.5 μm×0.5 μm and the number of measurement pieces of 256×256, and the CV value (an average value for three visual fields) was calculated from the results of the mapping analysis. The CV values of Example 31 and Example 35 are shown in Table 3.

Note that, in Experiment 3, even in any example, the ratio of the raw materials was adjusted to satisfy a compositional formula $K_{0.995}NbO_3$, and 1.0 part by mol of CuO and 0.5 parts by mol of ZnO were added as the subcomponent. The other experimental conditions were set to be similar as in Experiment 2, and Qm, ΔQm, and resistivity of the obtained piezoelectric composition samples were measured. Evaluation results are shown in Table 3.

TABLE 3

| Sample No. | Main component: $(K_xNa_y)NbO_3$ | | | Subcomponent | | Amount of carbon contained (ppm by weight) | CV value (−) | Mechanical quality coefficient Qm (−) | Stability with passage of time ΔQm (%) | Resistivity ρ (Ω · cm) |
|---|---|---|---|---|---|---|---|---|---|---|
| | x | y | x + y | Raw material 1 | Raw material 2 | | | | | |
| Example 31 | 0.995 | 0 | 0.995 | CuO | ZnO | 430 | 3.51 | 1940 | 6 | $4.5 \times 10^{11}$ |
| Example 35 | 0.995 | 0 | 0.995 | CuO | ZnO | 430 | 1.48 | 2420 | 5 | $2.8 \times 10^{12}$ |

As shown in Table 3, in Example 35 in which the CV value was smaller, Qm was higher and the resistivity became higher in comparison to Example 31. As a result, it could be confirmed that as carbon is uniformly dispersed in the piezoelectric composition, Qm becomes more higher and the insulation resistance becomes further satisfactory.

NUMERICAL REFERENCES

5 . . . Piezoelectric element
1 . . . Piezoelectric part
4 . . . Main phase grain
6 . . . grain boundary
8 . . . secondary phase
2, 3 . . . electrode
50 . . . (Multilayer) Piezoelectric element
10 . . . stacked body
11 . . . Piezoelectric layer
12 . . . internal electrode layer
21, 22 . . . terminal electrode

What is claimed is:
1. A piezoelectric composition comprising:
a carbon, and a main component composed of an alkali metal niobate based compound,
wherein an amount of the carbon contained is 360 to 500 ppm by weight, wherein
the alkali metal niobate based compound is expressed by a compositional formula of $(K_xNa_y)NbO_3$, and
y satisfies 0 and x satisfies a relationship of $0.980 \leq x \leq 1.000$.

2. The piezoelectric composition according to claim 1, wherein the amount of the carbon contained is 380 to 500 ppm by weight.

3. The piezoelectric composition according to claim 1, wherein a CV value of the carbon concentration distribution is 0.5 to 2.5 in a cross-section of the piezoelectric composition.

4. An electronic component comprising:
the piezoelectric composition according to claim 1.

5. The piezoelectric composition according to claim 1, wherein $0.980 \leq x+y \leq 0.998$.

6. The piezoelectric composition according to claim 1, wherein 10% or less of Nb atoms are substituted with atoms of Ta.

7. The piezoelectric composition according to claim 1, which additionally contains Cu.

8. The piezoelectric composition according to claim 1, which additionally contains one of Ge, Cr, Ni, and Zn.

9. The piezoelectric composition according to claim 7, which additionally contains one of Ge, Cr, Ni, and Zn.

10. The piezoelectric composition according to claim 1, wherein the amount of the carbon contained is 400 to 500 ppm by weight.

11. The piezoelectric composition according to claim 1, wherein the main component is present in main phase grains and the carbon is present mainly at grain boundaries and secondary phases existing between main phase grains.

12. The piezoelectric composition according to claim 11, wherein the main phase grains have an average grain size set to 0.5 to 20 μm in terms of an equivalent circle diameter and the secondary phase grains have an average grain size set to 1.0 to 3.0 times the average grain size of the main phase grains in terms of the equivalent circle diameter.

13. The piezoelectric composition according to claim 1, having a Qm of at least 1500 and a ΔQm of 20% or less.

14. The piezoelectric composition according to claim 1, having a Qm of at least 1800 and a ΔQm of 10% or less.

* * * * *